(12) United States Patent
Petersen et al.

(10) Patent No.: US 7,542,305 B2
(45) Date of Patent: Jun. 2, 2009

(54) MEMORY MODULE HAVING ON-PACKAGE OR ON-MODULE TERMINATION

(75) Inventors: Ryan M. Petersen, San Jose, CA (US); Franz Michael Schuette, Colorado Springs, CO (US)

(73) Assignee: OCZ Technology Group, Inc., San Jose, CA (US)

( * ) Notice: Subject to any disclaimer, the term of this patent is extended or adjusted under 35 U.S.C. 154(b) by 380 days.

(21) Appl. No.: 11/162,029

(22) Filed: Aug. 25, 2005

(65) Prior Publication Data
US 2006/0056215 A1   Mar. 16, 2006

Related U.S. Application Data

(60) Provisional application No. 60/522,171, filed on Aug. 25, 2004.

(51) Int. Cl.
*H01R 12/16* (2006.01)
(52) U.S. Cl. ............ 361/785; 361/764; 361/803; 365/63
(58) Field of Classification Search ......... 361/760–764, 361/785, 803; 365/51, 63
See application file for complete search history.

(56) References Cited

U.S. PATENT DOCUMENTS

| | | | | |
|---|---|---|---|---|
| 5,912,507 A | | 6/1999 | Dunn et al. ............ 257/767 |
| 6,084,425 A | * | 7/2000 | Liaw et al. ............ 326/30 |
| 6,108,212 A | | 8/2000 | Lach et al. ............ 361/768 |
| 6,266,252 B1 | | 7/2001 | Karabatsos ............ 361/788 |
| 6,597,277 B2 | | 7/2003 | Hellriegel ............ 338/310 |
| 6,737,749 B2 | | 5/2004 | Tomsio et al. ............ 257/774 |
| 6,754,129 B2 | * | 6/2004 | Khatri et al. ............ 365/226 |
| 6,839,241 B2 | * | 1/2005 | Benisek et al. ............ 361/760 |
| 2005/0002241 A1 | * | 1/2005 | Park et al. ............ 365/199 |
| 2005/0281096 A1 | * | 12/2005 | Bhakta et al. ............ 365/193 |

* cited by examiner

*Primary Examiner*—Tuan T Dinh
(74) *Attorney, Agent, or Firm*—Hartman & Hartman, P.C.; Gary M. Hartman; Domenica N. S. Hartman

(57) ABSTRACT

A memory module adapted for installation in an open memory socket on a mainboard of a computer. The memory module includes a substrate with an edge connector comprising pins along an edge of the substrate, and at least one memory package mounted to the substrate and containing a memory die electrically connected to input/output leads located along the perimeter of the memory package and through which data signals are transmitted to and from the memory die. Data signal lines electrically connect a plurality of the input/output leads of the memory package to a plurality of the pins of the edge connector. Termination resistors individually electrically connect each of the data signal lines to ground, a supply voltage, or a reference voltage of the memory package so as to reduce noise and signal reflections through the data signal lines.

10 Claims, 6 Drawing Sheets

MEMORY MODULE HAVING ON-PACKAGE OR ON-MODULE TERMINATION

CROSS REFERENCE TO RELATED APPLICATIONS

This application claims the benefit of U.S. Provisional Application No. 60/522,171, filed Aug. 25, 2004.

BACKGROUND OF THE INVENTION

The present invention generally relates to memory modules for installation in computer memory subsystems. More particularly, this invention relates to a memory module equipped with termination resistors located directly on or immediately adjacent the I/O pins of memory packages of the module to reduce noise and signal reflections.

The computer industry has moved to higher speed grades not only in the field of processor technology but also relating to all peripheral devices including the system memory. The latter has become the main bottleneck in the overall system performance in that, with increasing clock rates, the central processors are starved for data and more and more cycles are wasted idly because of the lack of data and instructions to be processed.

Memory clock and data frequency are limited primarily by two different factors, the first being the core and I/O design of the actual memory IC and the second being the interfacing with the rest of the system logic. In the case of the first, consumer-class graphics boards have shown that speed grades of 700-800 MHz data rate are within realistic expectations of high-grade components. However, one must bear in mind that this is achieved using a point to point connectivity without socketed interfaces.

One particular obstacle in the case of system memory is the interfacing of the memory devices themselves with the rest of the system. Such interfacing typically involves soldering memory components (e.g., packages) onto a substrate, such as a printed circuit board (PCB), forming what is commonly termed a memory module, and routing the signals in and out of the memory module through edge connectors on the PCB to a system board (mainboard or motherboard) using, for example, a dual in-line memory module (DIMM) socket (slot). This kind of interfacing necessarily involves the transition of all signals through a variety of interfaces that include both soldered and pressure contacts. Each transition from one medium to the next generates signal reflections that fill the bus with noise. If the noise levels reach a critical threshold, they will interfere with the signal integrity of the actual data, addresses, and commands and induce errors on several levels. Such degradation of signal quality can be of particularly concern with higher signal frequencies or with digital signals that exhibit shorter rise times. Where lower power supply voltages are employed, electrical resonances and reflections can also be of concern because lower noise is required to avoid detrimentally affecting signal integrity and electrical system reliability.

Suffice it to say that the amount and level of signal reflections are inversely correlated to the quality of the interface. Consequently, a major hurdle toward reaching clean signals is the socket interface formed by the edge connections of the memory module and the DIMM slot of the system board. The most common approach to reducing noise and increasing signal integrity as well as providing termination of the actual signal has been the use of termination resistors in signal paths. In the first generation DDR (or DDR-SDRAM—double data rate synchronous DRAM) architecture, termination is provided on the mainboard by means of a parallel resistor to the termination voltage (VTTI). One of the improvements of second generation DDR (DDR2) is the presence of the so-called on-die-termination (ODT). Briefly, ODT moves the point at which termination occurs as close to its source as possible—that is, the point of signal origin, which is the die itself. Because of this measure, the input/output (I/O) frequency can be increased since the improved termination scheme ameliorates shortcomings of the system PCB design and bus interface.

The most effective method for reducing noise and signal reflections is their elimination as close to their source as possible. As such, on-board (mainboard) termination is inferior to on-die termination, especially since the termination of all memory slots is shared and, by extension, the noise is shared between all modules in the system before it reaches the termination resistors. However, current die and package designs do not leave enough room to implement efficient termination in the package.

BRIEF SUMMARY OF THE INVENTION

The present invention provides an approach to reducing noise and signal reflections through the use of termination resistors directly on or immediately adjacent the I/O pins of the memory components, and terminating the resistors to ground, supply voltage, or reference voltage.

More particularly, this invention involves a memory module adapted for installation in an open memory socket on a mainboard of a computer. The memory module includes a substrate with an edge connector comprising pins along an edge of the substrate, at least one memory package mounted to the substrate and containing a memory die electrically connected to input/output leads located along the perimeter of the memory package and through which data signals are transmitted to and from the memory die, data signal lines electrically connecting a plurality of the input/output leads of the memory package to a plurality of the pins of the edge connector, and termination resistors individually electrically connecting each of the data signal lines to ground, a supply voltage, or a reference voltage of the memory package so as to reduce noise and signal reflections through the data signal lines. According to a preferred aspect of the invention, neither the memory die nor the mainboard requires termination resistors, though it should be understood that mainboard termination resistors are no hindrance to the use of the current invention.

In view of the above, the termination is not on-die, though it occurs as close as possible to the die and will not allow contention of the bus with noise. Another benefit in this approach is the minimum time until signal and noise are terminated, which frees the bus immediately after the actual signal is propagated, whereas, a noticeable delay is encountered in the case of an on-board termination on the mainboard.

According to an optional aspect of the invention, the termination resistors can be implemented in the form of a termination to the VRef value to help both high and low signal voltages to return to the crossover point much faster because of an additional push-pull mechanism for the high-low voltage swing. According to another optional aspect of the invention, the resistors can be terminated to the supply voltage (VDD or VSS) to account for asymmetries in the voltage swing, or a virtual termination voltage could be used that differs from VRef and can be adjusted above or below VRef to optimally compensate for asymmetries in the high-low voltage swing of the memory components used.

A shortcoming of static termination schemes is the constant passive current draw to the termination sink, which occurs regardless of whether the termination is at the level of the supply voltage, the ground or any termination voltage. In addition, termination of the signal itself will also weaken it and, therefore, have disadvantages in that it would require higher drive strength of the output buffers. For either reason, it can be advantageous to implement a switch to turn On or Off the termination depending on whether the devices are active or not. This type of dynamic termination is implemented in the on-die Termination of the DDR2 and later designs and reduces the passive power dissipation of the memory subsystem. Because of such benefits, the present invention encompasses an embodiment in which the chip select signal that selects the active physical bank within the memory subsystem (or another suitable signal) is used as a control signal to turn the termination On or Off.

In view of the above, the present invention provides for the elimination or at least significant reductions in signal reflections directly adjacent to the die, which results in faster termination of signals and freeing up the bus. Because the invention can be implemented by modifying only the memory module, such as the PCB, and does not require modifications to the mainboard or memory die, the invention offers the further advantage of backward compatibility with existing systems. According to optional aspects of the invention, the above advantages can be obtained while also adjusting for asymmetries of the memory component electrical characteristics.

Other objects and advantages of this invention will be better appreciated from the following detailed description.

DETAILED DESCRIPTION OF THE INVENTION

Figure 1:
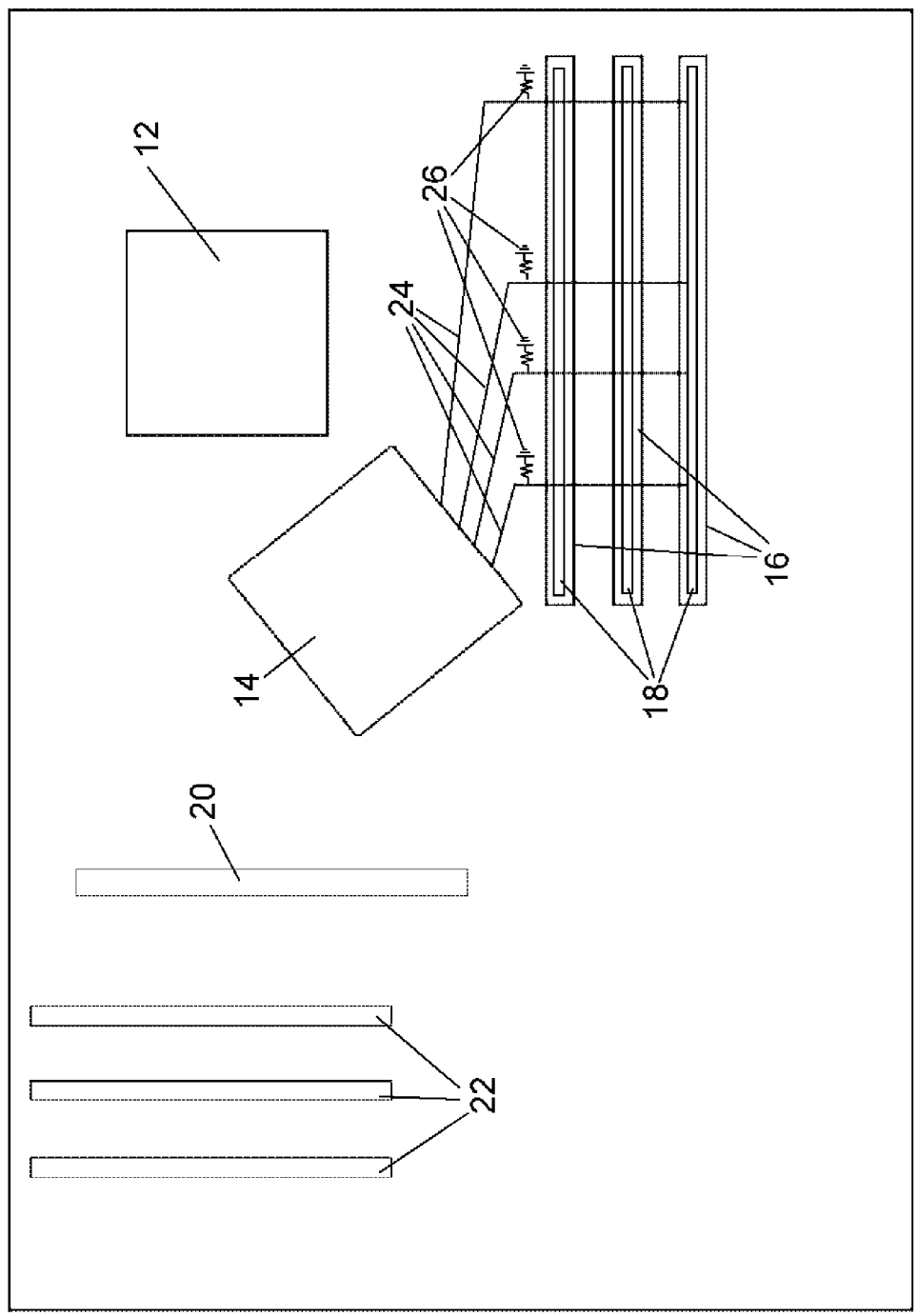
FIG. 1 shows a schematic layout of a computer mainboard with on-board termination resistors to ground in accordance with the prior art.

As previously discussed, the problem of signal reflections in memory subsystems of computers has typically been addressed in the past by adding termination resistors on the mainboard. Such an approach is depicted in FIG. 1, which shows a schematic layout of a computer mainboard 10, including a CPU socket 12 and a chipset containing a memory controller 14 connected to memory slots (sockets) 16 with data lines 24. Memory modules 18, such as single in-line memory modules (SIMM's) or dual in-line memory modules (DIMM's), are represented as being installed in memory slots 16. Also shown is a graphics interface 20 (AGP or PCIe or similar) and expansion slots 22. In accordance with conventional mainboard termination approaches to reducing signal reflection, each of the data lines 24 is schematically portrayed as being individually terminated to ground with a termination resistor 26. In practice, the positions of the termination resistors 26 will depend on the specific layout of the mainboard 10.

Figure 2:
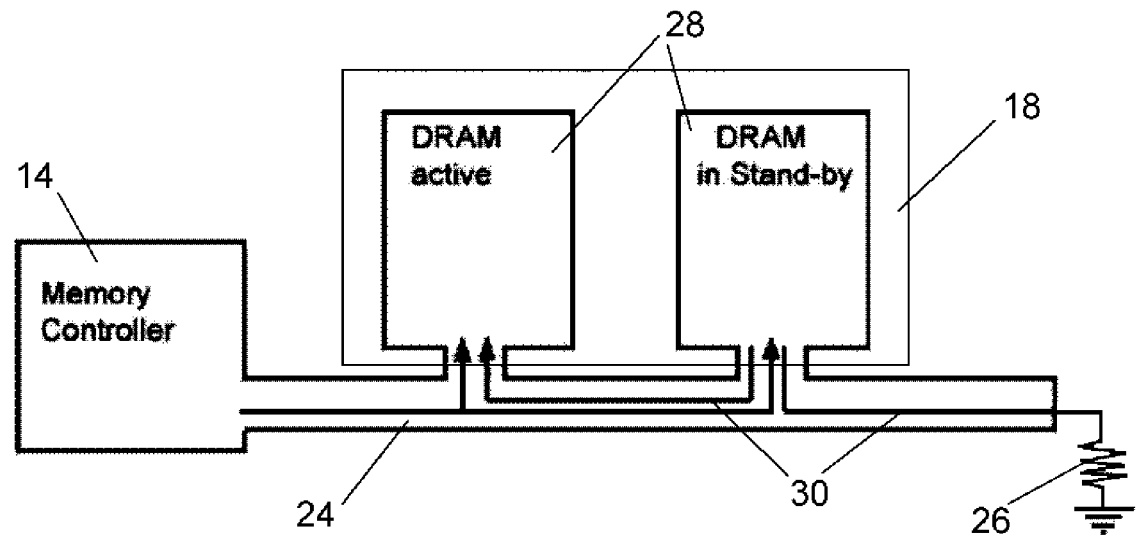
FIGS. 2 and 3 provide a schematic comparison of mainboard termination and on-die-termination in accordance with prior art practices.
Figure 3:
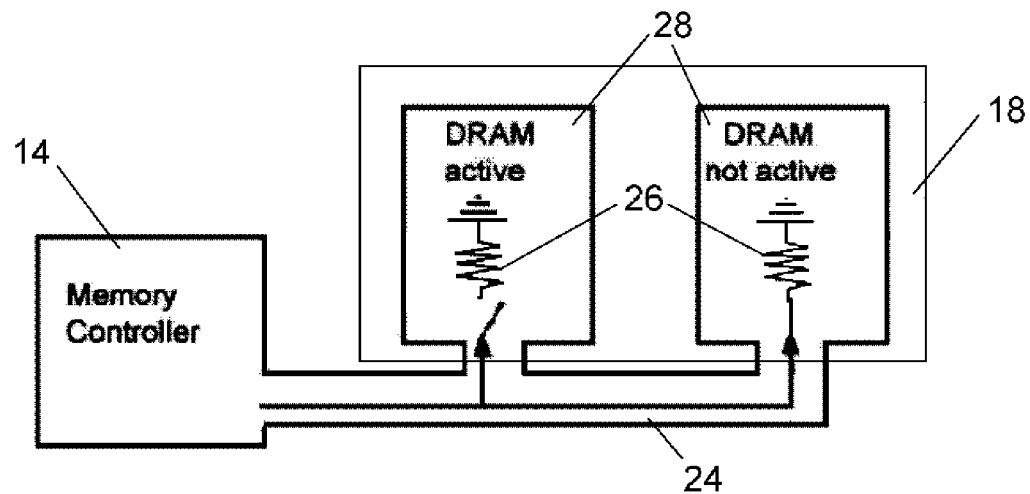

FIG. 2 is a schematic representation of the termination approach of FIG. 1, and in combination with FIG. 3 provides a schematic comparison of mainboard termination and the more recent on-die-termination (ODT) approach. In FIG. 2, signal reflections 30 are represented as occurring between a pair of memory components, identified in FIG. 2 as DRAM packages 28, one of which is denoted as being active while the other is in stand-by. In contrast, the on-die-termination approach of FIG. 3 is represented as eliminating inter-component reflections by placing termination resistors 26 directly on the dies within the packages 28. Integration of resistor termination directly onto the memory die as represented in FIG. 3 has been adopted in second and third generation DDR (DDR2 and DDR3, respectively). The on-die-termination approach depicted in FIG. 3 is dynamic, meaning that it can be turned on and off depending on load as opposed to the static termination used on the mainboard of FIGS. 1 and 2. In addition, on-die-termination techniques allow for changes in the resistor value depending on the overall system memory density during memory initialization on boot-up. However, while providing the above advantages, the approach taken in FIG. 3 cannot be retrofitted to existing dies without substantial changes and costs to integrate such on-die-termination into existing designs.

Figure 4:
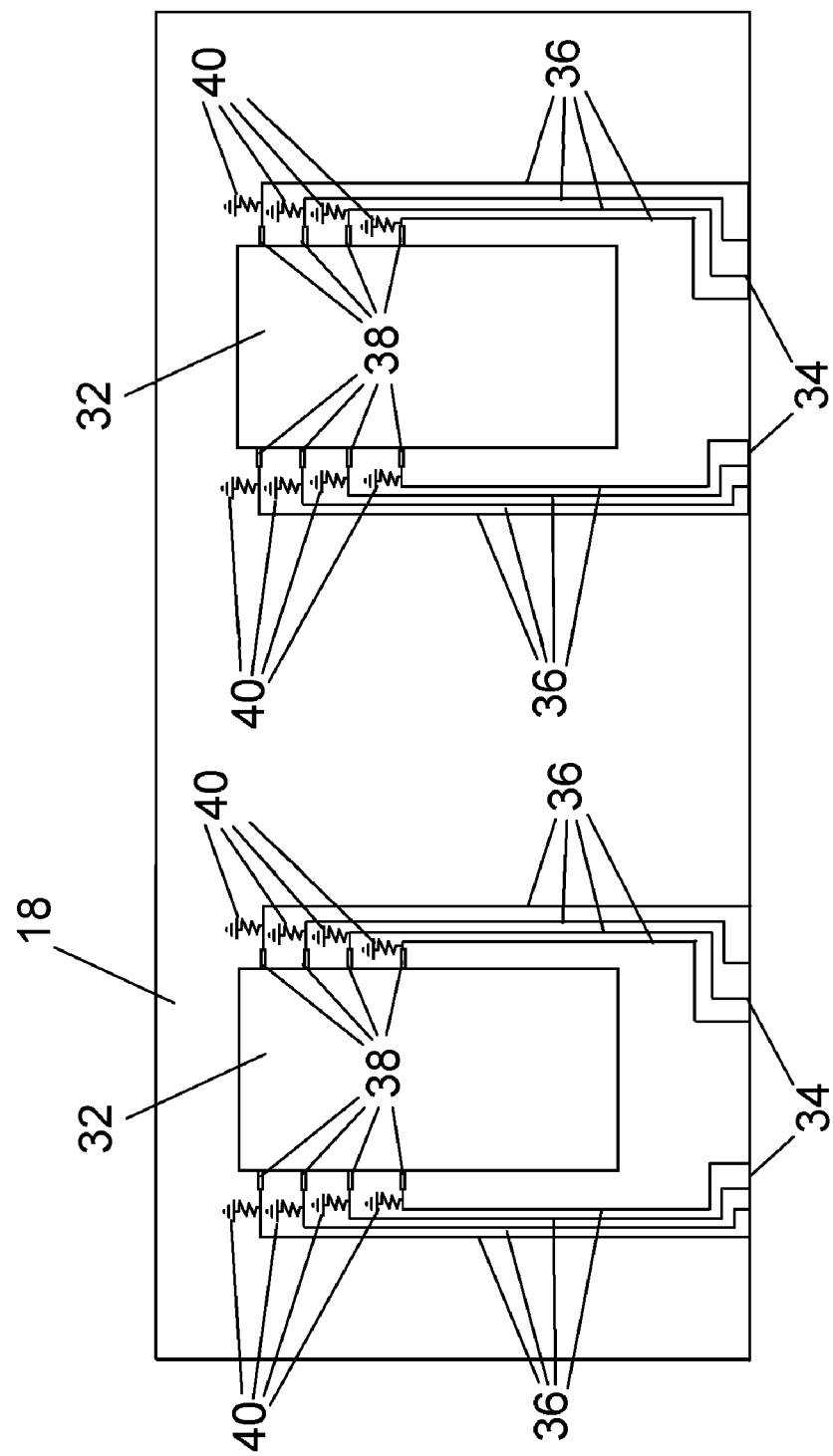
FIG. 4 shows a schematic representation of termination resistors terminating I/O lines on a memory module PCB in accordance with an embodiment of the present invention.
Figure 5:
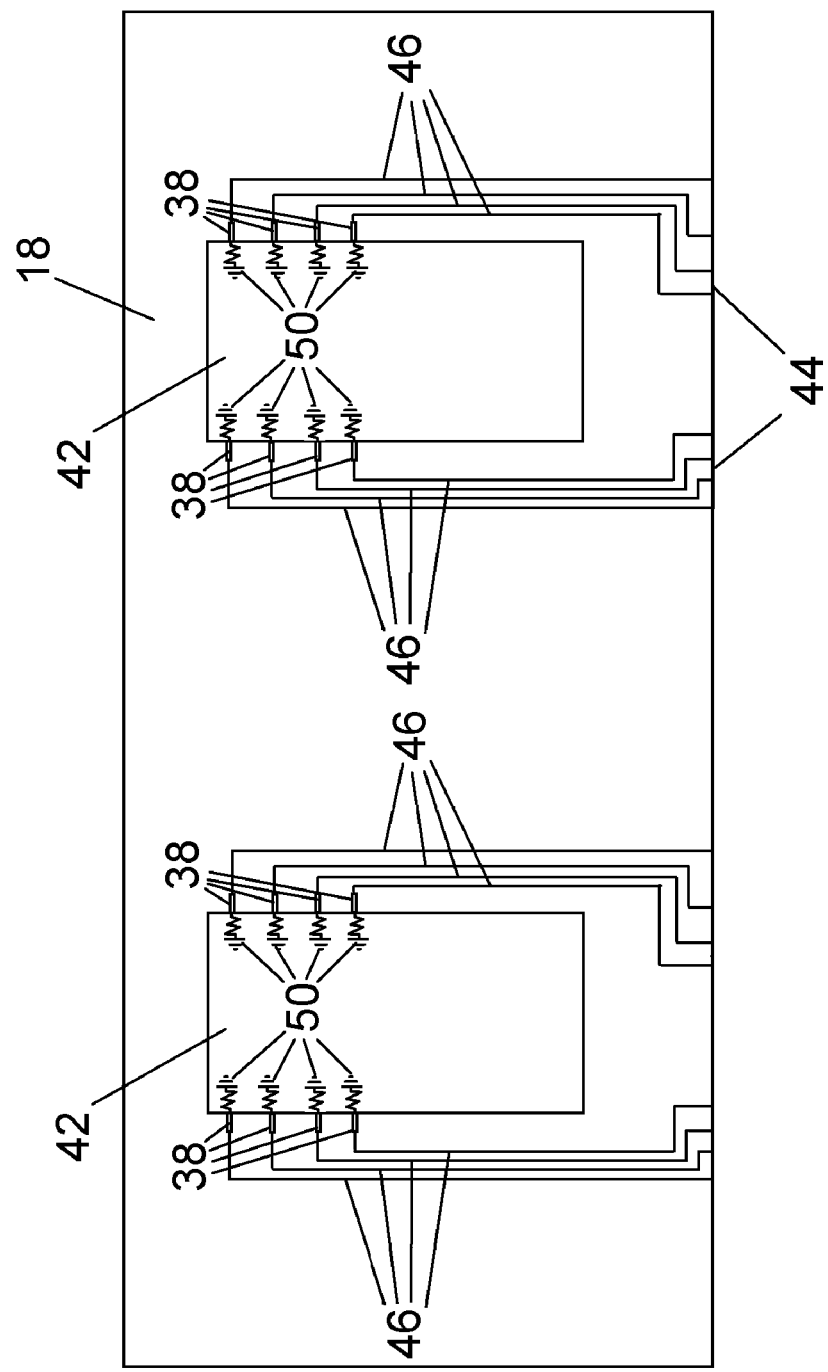
FIG. 5 shows a schematic representation terminating the output of a memory DRAM package with an on-package integrated resistor network that can be tied either to the termination voltage, to ground, or to the supply voltage in accordance with another embodiment of the present invention.

FIGS. 4 and 5 schematically represent two approaches by which signal reflections can be eliminated or reduced and the above-noted disadvantages of the prior art overcome by placing termination resistors at or immediately adjacent the I/O leads of memory component packages. As such, termination is integrated onto the memory module PCB or the memory package, as opposed to the mainboard (on which the module is installed) or the memory die (contained within the memory package). In this manner, the signals are terminated long before they reach the mainboard. Aside from elimination of ringing and interferences between the reflected signals and those generated by either the memory packages or the memory controller, an additional benefit is that signal reflections and other interface-generated noise never reach the mainboard traces (e.g., lines 24 in FIG. 1) that are shared among memory modules on a per channel basis. Therefore, an advantage of the current invention is that a signal reflection from, for example, DIMM 0, that causes some undesired stray signals on the bus is not broadcasted toward any other memory modules, for example, DIMM 1, DIMM 2, etc., where they could interfere with signal integrity. Finally, in addition to providing advantages with respect to better signal integrity, the present invention also enables memory modules to remain backwards-compatible with previous memory subsystems and memory dies, making higher frequency operation possible beyond the original scope of the DDR design since termination of stray signals occurs faster and the bus is freed up faster.

In FIG. 4, a memory package 32, such as a DRAM, SDR SDRAM, or DDR SDRAM chip, is schematically represented on part of a PCB 18 of a memory module, such as a SIMM or DIMM. For clarity, only the features of the package 32 and PCB 18 necessary for those skilled in the art to gain an understanding of the invention are shown. Data signal lines 36 electrically connect I/O leads (pins) 38 of the package 32 to I/O pins of an edge connector 34 on the PCB 18. Parallel termination resistors 40 are represented as being located on the PCB 18 immediately adjacent the I/O leads 38 of the package 32. As used herein, the resistors 40 are said to be immediately adjacent the I/O leads 38 on the basis that the resistors 40 are physically located between the package 32 and any adjacent memory component, as opposed to being located on the PCB 18 between the package 32 and the edge connector 34. More particularly, the resistors 40 are depicted in FIG. 4 as being connected to the signal lines 36 as close as physically possible to the leads 38, with the result that the resistors 40 are generally aligned along the edges of the package 32 with some of the resistors 40 being between adjacent signal lines 36. Instead of being placed alongside the package 32, it is also within the scope to terminate the termination resistors 40 to a common termination voltage beneath the package 32 to ensure equal path lengths for all signal lines to the termination device. The resistors 40 may be thick-film resistors or discrete resistors mounted to the PCB 18 or integral parts of a customized PCB 18. Suitable resistance values for the resistors 40 are in a range of about 20 to about 150 ohms, more preferably about 60 to about 110 ohms.

As with FIG. 4, FIG. 5 also depicts only those features necessary to gain an understanding of the invention. FIG. 5 schematic represents the placement of parallel termination resistors 50 as part of an integrated resistor network formed directly on the exterior of a memory package 42. As such, the resistors 50 are said to be immediately adjacent the I/O leads 38 on the basis that the resistors 50 are physically located on the package 42, though not on the memory die (not shown) within the package 42. Similar to FIG. 4, I/O leads 48 of the package 42 are electrically connected via signal lines 46 to I/O pins of an edge connector 44 of the PCB 18. Because the resistors 50 are located on the package 42, they can be tied either to ground, the termination voltage (VTT), or the supply voltage (VSS) of the package 42. As with the embodiment of FIG. 4, the resistors 50 may be thick-film resistors or discrete resistors mounted to the package 42 or integrated into the PCB design, and suitable and preferred resistance values for the resistors 50 are in a range of about 20 to about 150 ohms and about 60 to about 110 ohms, respectively.

From the above, those skilled in the art will appreciate that the embodiments of FIGS. 4 and 5 are able to provide memory module manufacturers with such additional benefits as the possibility of selectively tuning the termination values to match the detailed characteristics of the memory components used. Moreover, the current invention allows a much higher degree of flexibility in the design in that, in addition to termination of I/O signals, address and command signals can also be terminated using the on-module and on-package termination approaches of this invention.

Figure 6:
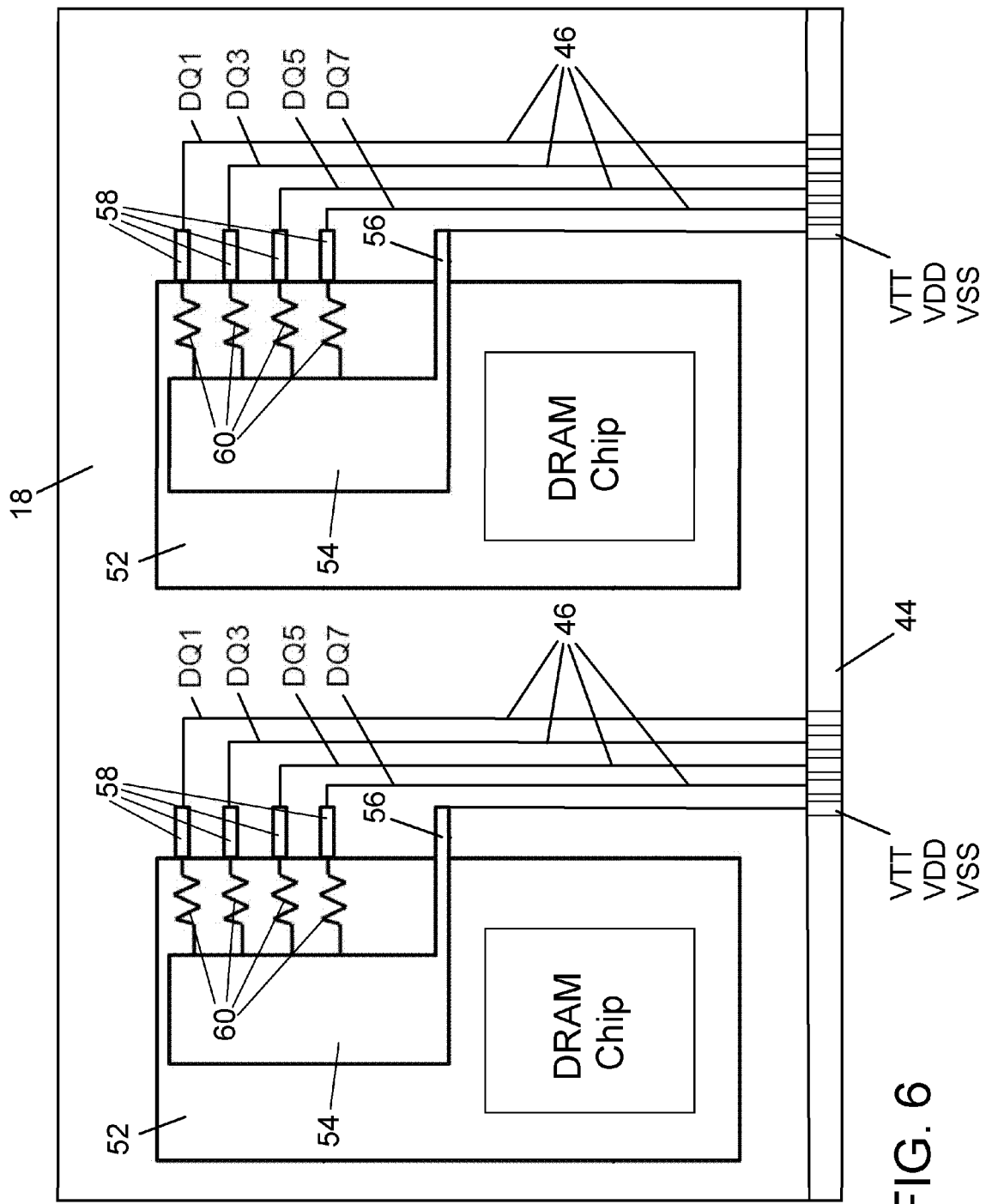
FIG. 6 shows a schematic representation of an on-package termination of I/O pins to the reference voltage (VTT) in accordance with a third embodiment of the present invention.

According to an alternative approach of the invention, termination resistors can be implemented in the form of a termination to the VRef value to help both high and low signal voltages to return to the crossover point much faster because of an additional push-pull mechanism for the voltage swing. Such an approach is represented in FIG. 6, in which on-package termination of a DRAM package 52 is represented with I/O leads 58 of the package 52 being terminated to the reference voltage VTT. For this purpose, a conducting plane 54 is shown connected to the VTT supply 56, and each I/O lead 58 is individually connected to the plane 54 with a resistor 60. A suitable resistance value for the resistors 60 is about 100 ohms resistor, with a suitable range being about 20 to about 150 ohms. With this same approach, the termination resistors 60 could be terminated to supply voltage (VDD or VSS) or ground to account for asymmetries in the signal swing. Another alternative is to terminate the resistors 60 to a virtual termination voltage that differs from VRef and can be adjusted above or below VRef to optimally compensate for asymmetries in the high-low voltage swing of the memory components used. The bias achieved this way allows precise matching of high and low times (with reference to the crossover point) by shifting the termination voltage to a positive or negative bias. Since the highest attainable frequency is limited by the shorter of the two clock hemi-cycles, distributing 50% each to high and low voltage swing would allow the module to run at the highest frequency attainable by the package 52.

Figure 7:
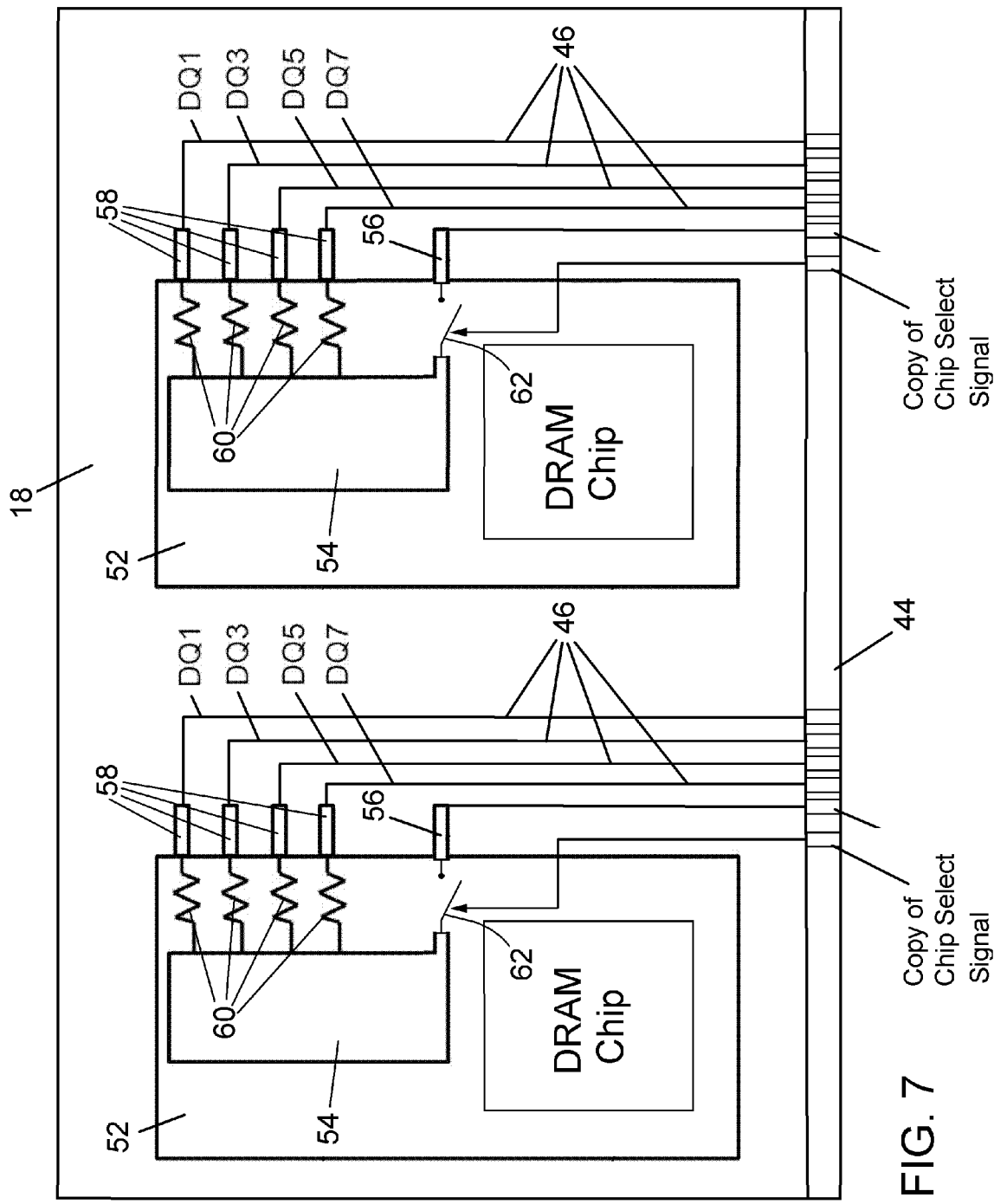
FIG. 7 shows a schematic representation of an on-package termination of I/O pins to the reference voltage (VTT), which can be turned On or Off using the Chip Select signal as a control signal in accordance with a fourth embodiment of the present invention.

According to an additional aspect of the invention, the termination drain can be dynamically coupled or decoupled to the termination resistors 60 as shown in FIG. 7, where a switch 62 is implemented using the chip select signal as control signal for opening or closing of the connection to the termination voltage, thus turning On and Off the termination according to whether the physical bank of memory is active or not. It should be understood that other signals such as, for example, the write-enable signal could be used to differentiate the termination according to Read or Write.

While the invention has been described in terms of a preferred embodiment, it is apparent that other forms could be adopted by one skilled in the art. Therefore, the scope of the invention is to be limited only by the following claims.

What is claimed is:

1. A memory module installed in a memory socket on a mainboard of a computer, the memory module comprising:
    a substrate;
    an edge connector comprising pins along an edge of the substrate;
    multiple memory packages mounted to the substrate, each of the memory packages containing a memory die electrically connected to input/output leads located on the memory package and through which data signals are transmitted to and from the memory die;
    data signal lines electrically connecting a plurality of the input/output leads of the memory package to a plurality of the pins of the edge connector; and
    termination resistors mounted on each of the memory packages and individually terminating each of the input/output leads of each memory package to a supply voltage or a reference voltage of the memory package;
    wherein the memory die and the mainboard lack termination resistors, and the termination resistors operate to reduce noise and signal reflections through the data signal lines.

2. The memory module according to claim 1, further comprising a switch operable to dynamically couple and decouple the termination resistors according to whether a physical bank of memory is active or not.

3. The memory module according to claim 1, wherein the memory module is chosen from the group consisting of single in-line memory modules and dual in-line memory modules.

4. The memory module according to claim 1, wherein the memory packages are chosen from the group consisting of DRAM, SDR SDRAM, and DDR SDRAM chips.

5. The memory module according to claim 1, wherein the termination resistors are electrically connected to the supply voltage.

6. The memory module according to claim 1, wherein the termination resistors are electrically connected to the reference voltage.

7. The memory module according to claim 1, wherein the termination resistors are terminated to the reference voltage and operate to assist high and low signal voltages to return to a crossover point of the memory package via a push-pull mechanism for the voltage swing.

8. The memory module according to claim 1, wherein the termination resistors are terminated to the supply voltage and compensate for asymmetries in the high-low voltage swing of the memory package.

9. The memory module according to claim 1, wherein the termination resistors are connected to the supply voltage or the reference voltage through a conducting plane on the memory package.

10. The memory module according to claim 1, wherein the termination resistors are terminated to a virtual termination voltage that differs from the reference voltage of the memory package and is adjusted above and below the reference voltage to compensate for asymmetries in the high-low voltage swing of the memory package.

* * * * *